US012663468B2

(12) United States Patent
Perez Chamorro et al.

(10) Patent No.: US 12,663,468 B2
(45) Date of Patent: Jun. 23, 2026

(54) SYSTEM AND METHOD FOR DETECTING FAULTS IN INTEGRATED CIRCUITS

(71) Applicant: NXP B.V., Eindhoven (NL)

(72) Inventors: Jorge Ernesto Perez Chamorro, Préverenges (CH); Vasudev Srinivasan, Mysuru (IN); Andreas Lentz, Buchholz (DE); Jean-Michel Cioranesco, Schenefeld (DE)

(73) Assignee: NXP B.V., Eindhoven (NL)

( * ) Notice: Subject to any disclaimer, the term of this patent is extended or adjusted under 35 U.S.C. 154(b) by 299 days.

(21) Appl. No.: 18/360,147

(22) Filed: Jul. 27, 2023

(65) Prior Publication Data

US 2024/0393391 A1     Nov. 28, 2024

(30) Foreign Application Priority Data

May 23, 2023    (IN) .............................. 202341035854

(51) Int. Cl.
G01R 31/317 (2006.01)

(52) U.S. Cl.
CPC .............................. G01R 31/31727 (2013.01)

(58) Field of Classification Search
CPC ................................................ G01R 31/31727
USPC .......................................................... 714/816
See application file for complete search history.

(56) References Cited

U.S. PATENT DOCUMENTS

| | | | | | |
|---|---|---|---|---|---|
| 5,502,732 | A | * | 3/1996 | Arroyo | G11C 29/02 |
| | | | | | 714/724 |
| 11,762,736 | B2 | * | 9/2023 | Kim | G06F 11/1068 |
| | | | | | 714/764 |
| 2003/0061560 | A1 | * | 3/2003 | Furukawa | G11C 11/56 |
| | | | | | 714/764 |

(Continued)

FOREIGN PATENT DOCUMENTS

| | | |
|---|---|---|
| CN | 2013086267 W | 12/2014 |
| TW | 103123846 A | 4/2015 |
| WO | 2014190666 A1 | 12/2014 |

OTHER PUBLICATIONS

Dumont, M. et al.; "Modeling and Simulating Electromagnetic Fault Injection"; IEEE Transactions on Computer-Aided Design of Integrated Circuits and Systems, vol. 40, Issue 4, Jun. 18, 2020; DOI: 10.1109/TCAD.2020.3003287.

(Continued)

*Primary Examiner* — James C Kerveros

(57) ABSTRACT

A fault detection system includes a state register, an error detection code (EDC) register, logic circuitry, an EDC generator, and an EDC checker. The state and EDC registers store first reference data and first checksum data, respectively. The logic circuitry executes a logic function based on the first reference data to iteratively generate second reference data that is different from the first reference data, and updates the first reference data of the state register with the second reference data of one iteration. The EDC generator iteratively generates second checksum data based on the iteratively generated second reference data and updates the (Continued)

first checksum data of the EDC register with the second checksum data of one iteration. The EDC checker detects a fault in the IC based on the updated first reference data and the updated first checksum data.

20 Claims, 5 Drawing Sheets

(56)                    References Cited

U.S. PATENT DOCUMENTS

| | | | |
|---|---|---|---|
| 2008/0082869 A1* | 4/2008 | Sugawara | G06F 11/1016 |
| | | | 714/702 |
| 2012/0144261 A1* | 6/2012 | Hong | G06F 11/1048 |
| | | | 714/755 |
| 2013/0166986 A1* | 6/2013 | Alrod | G06F 11/1048 |
| | | | 714/755 |
| 2023/0153197 A1* | 5/2023 | Kaushik | G11C 29/024 |
| | | | 714/768 |

OTHER PUBLICATIONS

Dumont, Mathieu et al.; "Modeling of Electromagnetic Fault Injection"; 12th International Workshop on the Electromagnetic Compatibility of Integrated Circuits (EMC Compo); Oct. 21-23, 2019, Hangzhou, China; DOI: 10.1109/EMCCompo.2019.8919964.

Gnad, Dennis R.E., et al.; "An Experimental Evaluation and Analysis of Transient Voltage Fluctuations in FPGAs"; IEEE Transactions on Very Large Scale Integration (VLSI) Systems; vol. 26, Issue No. 10, Oct. 2018; DOI: 10.1109/TVLSI.2018.2848460.

Nemiroff, Daniel et al.; "Fault-Injection Countermeasures, Deployed at Scale"; available at https://www.intel.com/ content/dam/www/ central-libraries/US/en/documents/2022-08/white-paper-fault-injection-countermeasures-deployed-at-scale.pdf; Aug. 2022.

Zick, Kenneth M., et al.; "Sensing nanosecond-scale voltage attacks and natural transients in FPGAs;" FPGA '13: Proceedings of the ACM/SIGDA international symposium on Field programmable gate arrays; Feb. 11-13, 2013, Monterey, California; https://doi.org/10.1145/2435264.2435283.

* cited by examiner

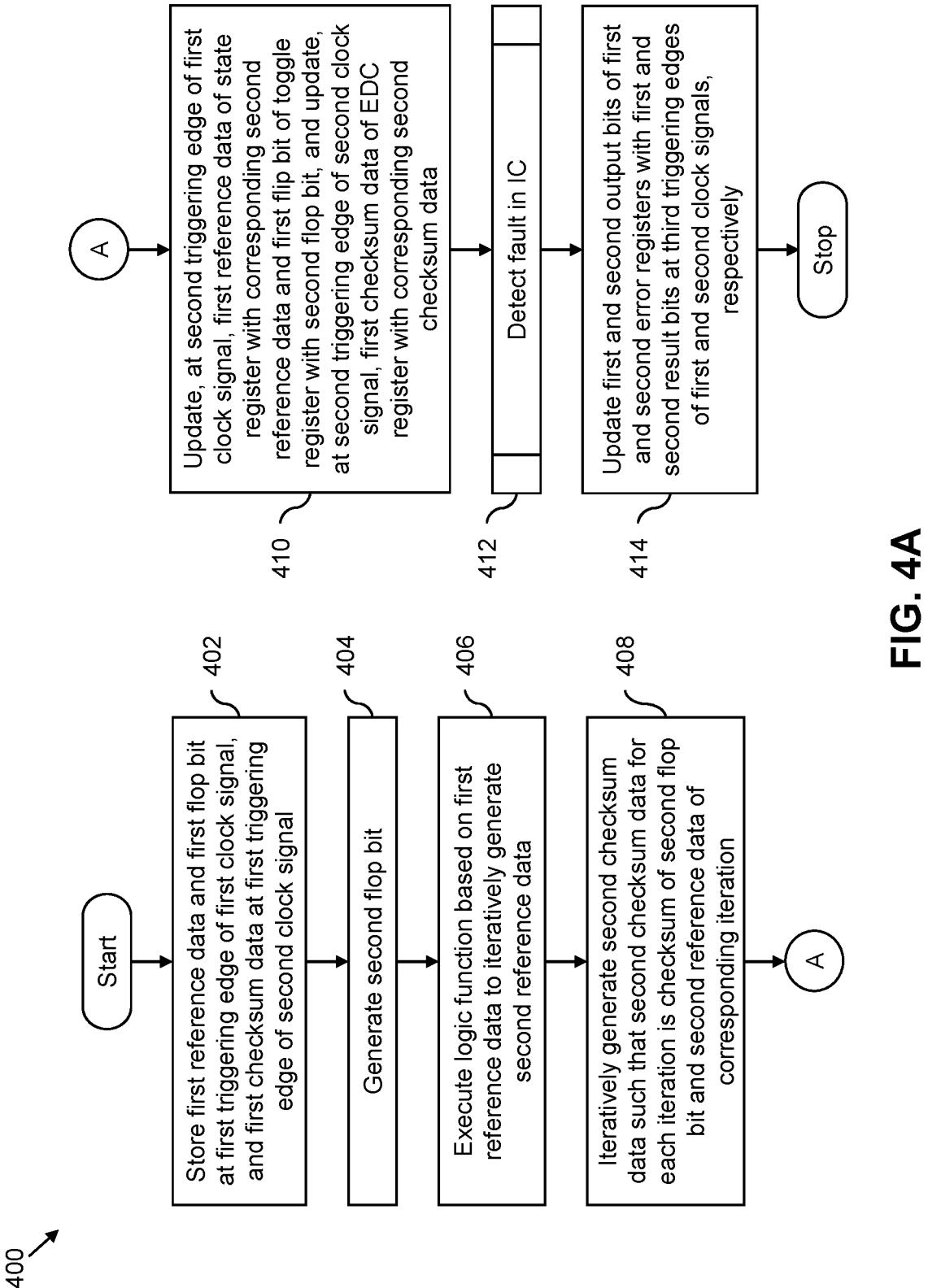

Start

402 — Store first reference data and first flop bit at first triggering edge of first clock signal, and first checksum data at first triggering edge of second clock signal 404 — Generate second flop bit 406 — Execute logic function based on first reference data to iteratively generate second reference data 408 — Iteratively generate second checksum data such that second checksum data for each iteration is checksum of second flop bit and second reference data of corresponding iteration

A

A

410 — Update, at second triggering edge of first clock signal, first reference data of state register with corresponding second reference data and first flip bit of toggle register with second flop bit, and update, at second triggering edge of second clock signal, first checksum data of EDC register with corresponding second checksum data 412 — Detect fault in IC 414 — Update first and second output bits of first and second error registers with first and second result bits at third triggering edges of first and second clock signals, respectively Stop

SYSTEM AND METHOD FOR DETECTING FAULTS IN INTEGRATED CIRCUITS

CROSS-REFERENCE TO RELATED APPLICATIONS

This application claims priority under 35 U.S.C. § 119 to India patent application Ser. No. 202341035854, filed on May 23, 2023, the contents of which are incorporated by reference herein.

FIELD OF USE

The present disclosure relates generally to electronic circuits, and, more particularly, to a system and a method for detecting faults in integrated circuits.

BACKGROUND

An integrated circuit (IC) typically experiences various fault injection attacks thereon. Examples of the fault injection attacks include power glitching attacks, electromagnetic fault injection attacks, or the like. These attacks induce various faults in the IC that may cause malfunctioning of one or more components of the IC or the IC as a whole, thereby compromising the security of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIGS. 4A and 4B, collectively, represent a flowchart that illustrates a fault detection method in accordance with an embodiment of the present disclosure.

DETAILED DESCRIPTION

Figure 1:
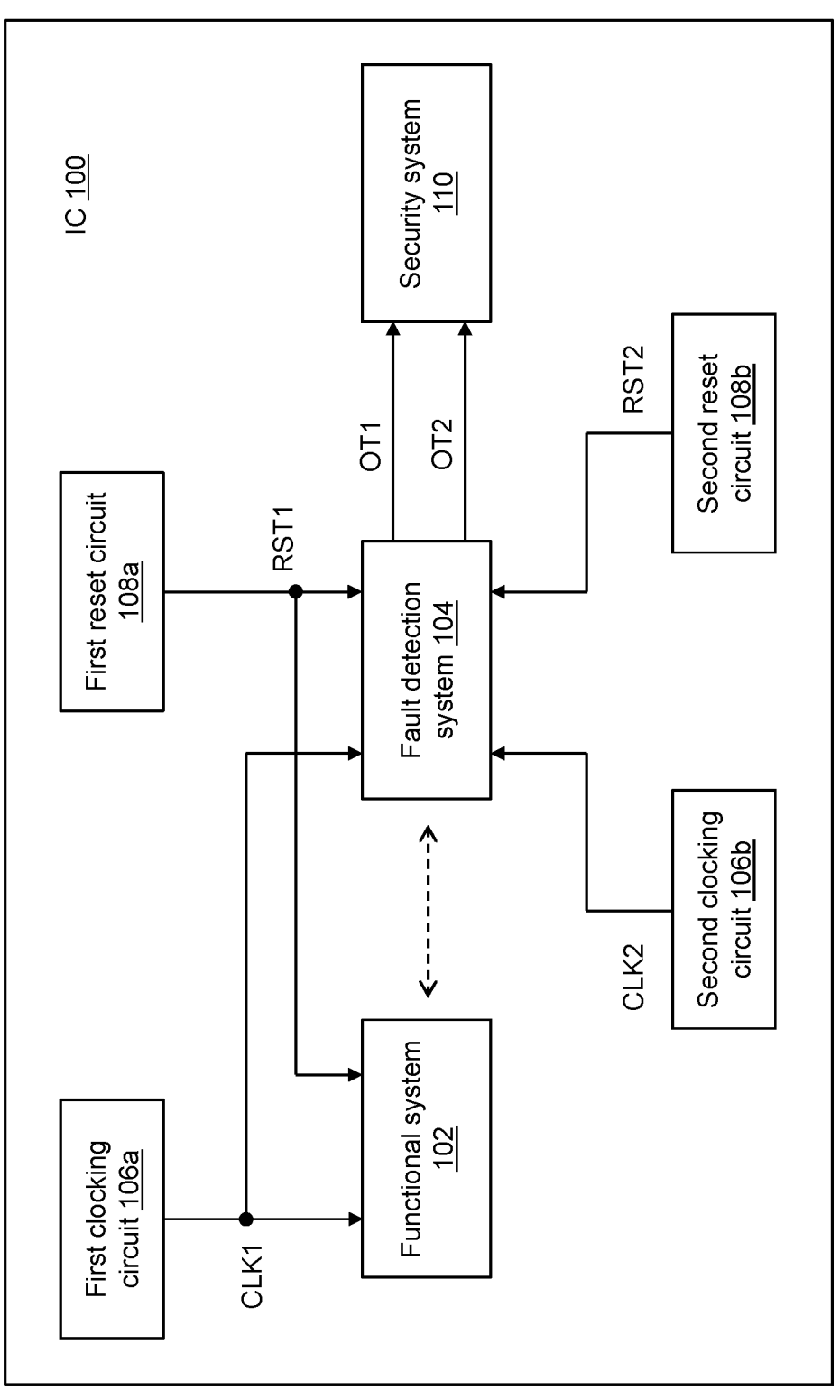
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Overview

Conventionally, to detect a fault injection attack on an integrated circuit (IC), a fault detection system is included in the IC. The fault detection system monitors a power supply of the IC to detect the fault injection attack (e.g., a power glitching attack) on the IC. Once the fault injection attack is detected, various recovery operations may be executed to maintain the security of the IC. The fault detection system utilizes various analog components (e.g., voltage reference generators, delay lines, or the like). Such analog components occupy a significant area on the IC, and hence, limit the number of fault detection systems that may be included in the IC. Further, the fault detection system is typically integrated with a functional system of the IC to enable fault detection. As a result, the functional system is required to be modified, thereby leading to increased complexity of the IC. Additionally, the fault detection system is capable of detecting exclusively the power glitching attacks, thereby rendering the IC vulnerable to other types of fault injection attacks (e.g., electromagnetic fault injection attacks).

Various embodiments of the present disclosure disclose an IC including a functional system and a fault detection system. The functional system may execute one or more critical operations associated with the IC. Further, the fault detection system is present within a predefined distance of the functional system to enable the detection of a fault injection attack on the functional system. The fault detection system may include a state register, an error detection code (EDC) register, logic circuitry, a first EDC generator, a toggle register, an inverter, and an EDC checker.

The state and toggle registers may operate in synchronization with a first clock signal and the EDC register may operate in synchronization with a second clock signal. Further, the state and toggle registers may store first reference data and a first flop bit at a first triggering edge of the first clock signal, respectively, and the EDC register may store first checksum data at a first triggering edge of the second clock signal. The logic circuitry may execute a logic function based on the first reference data to iteratively generate second reference data that is different from the first reference data, and update the first reference data of the state register at a second triggering edge of the first clock signal with the corresponding second reference data. Similarly, the inverter may generate a second flop bit that is an inverted version of the first flop bit and update the first flop bit of the toggle register at the second triggering edge of the first clock signal with the second flop bit. The first EDC generator may iteratively generate second checksum data such that the second checksum data for each iteration is a checksum of the corresponding second reference data and the second flop bit, and update the first checksum data of the EDC register at a second triggering edge of the second clock signal with the corresponding second checksum data.

The EDC checker may detect a fault in the IC based on the updated first reference data, the updated first flop bit, and the updated first checksum data. For example, the EDC checker may include a second EDC generator and a comparator. The second EDC generator may generate third checksum data as a checksum of the updated first reference data and the updated first flop bit. Further, the comparator may compare the updated first checksum data and the third checksum data and detect the fault in the IC based on a mismatch between the updated first checksum data and the third checksum data.

For any type of fault injection attack (e.g., a power glitching attack, an electromagnetic fault injection attack, a clock glitching attack, a light injection attack, a forward body bias injection attack, or the like) on the IC, the updated first checksum data does not match the third checksum data. As a result, the fault detection system of the present disclosure is capable of detecting more types of fault injection attacks than a conventional fault detection system that is capable of detecting exclusively the power glitching attacks. Further, to detect the fault injection attack on the functional system, the fault detection system of the present disclosure is placed within the predefined distance of the functional system and the functional system is not required to be modified. As a result, the complexity of the IC of the present disclosure is significantly less than that of an IC that includes the conventional fault detection system. Additionally, the components of the fault detection system are digital components which occupy a significantly lesser area on the IC as compared to that occupied by analog components of the conventional fault detection system. Consequently, a significantly greater number of fault detection systems may be included in the IC of the present disclosure. Thus, the fault coverage provided in the IC of the present disclosure is significantly greater than that in the IC that includes the conventional fault detection system.

FIG. 1 illustrates a schematic block diagram of an integrated circuit (IC) 100 in accordance with an embodiment of the present disclosure. The IC 100 may include a functional system 102, a fault detection system 104, first and second clocking circuits 106a and 106b, first and second reset circuits 108a and 108b, and a security system 110. The IC 100 may be utilized in a variety of applications such as mobile devices, automotive, networking, or the like.

The functional system 102 may be configured to execute one or more critical operations associated with the IC 100. Examples of the one or more critical operations include cryptographic operations, access control operations, or the like. Typically, the IC 100 is prone to a fault injection attack which induces a fault therein to disrupt the one or more critical operations. The fault may correspond to a sampling fault that results in parasitic currents at input terminals of synchronous circuits (such as flip-flops) which disrupt the operations of the synchronous circuits (e.g., an output of a D flip-flop may not be the same as the input). Thus, the fault injection attack may cause the functional system 102 to operate in an error state, and in turn, reveal security data (e.g., cryptographic keys) associated with the IC 100. In an embodiment, the functional system 102 may include one or more functional circuits such as cryptographic accelerators, math accelerators, processors, core circuits, high-toggling circuits, switching circuits, or the like.

Examples of the fault injection attack include a power glitching attack, an electromagnetic fault injection attack, a clock glitching attack, a light injection attack, a forward body bias injection attack, or the like. In the power glitching attack, various power supplies of the IC 100 may be attacked to alter supply voltages of the functional system 102, and in turn, compromise the security of the IC 100. The electromagnetic fault injection attack involves the utilization of an electromagnetic pulse on a localized portion of the IC 100 to affect the functional system 102 present in the vicinity of the attack. Similarly, the light injection attack utilizes a light beam (e.g., a laser beam) to alter the critical operations of the functional system 102. Further, the forward body bias injection attack and the clock glitching attack lead to various perturbations in the transistors or a clock tree of the IC 100, respectively. The perturbations may be caused by way of voltage pulses. Further, the perturbations may compromise the security of the IC 100.

The fault induced by the fault injection attack is thus detrimental to the security of the IC 100. Hence, in the present disclosure, the IC 100 includes the fault detection system 104 to detect the induced fault and the security system 110 to take appropriate measures to recover the IC 100 and to ensure that the security of the IC 100 is not compromised.

The fault detection system 104 is present within a predefined distance of the functional system 102 to enable the detection of the fault injection attack on the functional system 102. The predefined distance is determined such that any fault injection attack on the functional system 102 also causes perturbations in the fault detection system 104. Clocking and reset operations of the functional system 102 and the fault detection system 104 are required to be executed in a similar manner to enable accurate fault detection. Hence, each of the functional system 102 and the fault detection system 104 may be coupled to the first clocking circuit 106a and the first reset circuit 108a. The first clocking circuit 106a and the first reset circuit 108a may include suitable circuitry that may be configured to execute one or more operations. For example, the first clocking circuit 106a may be configured to generate a first clock signal CLK1 and provide the first clock signal CLK1 to the functional system 102 and the fault detection system 104. Similarly, the first reset circuit 108a may be configured to generate a first reset signal RST1 and provide the first reset signal RST1 to the functional system 102 and the fault detection system 104. The clocking and reset operations of each of the functional system 102 and the fault detection system 104 are controlled based on the first clock signal CLK1 and the first reset signal RST1, respectively.

In some cases, the fault injection attack on the IC 100 may induce faults in the first clock signal CLK1 and the first reset signal RST1. Hence, to enable the detection of such faults, the second clocking circuit 106b and the second reset circuit 108b are included in the IC 100.

The second clocking circuit 106b and the second reset circuit 108b may include suitable circuitry that may be configured to execute one or more operations. For example, the second clocking circuit 106b may be configured to generate a second clock signal CLK2 and the second reset circuit 108b may be configured to generate a second reset signal RST2. In an embodiment, the first clocking circuit 106a and the second clocking circuit 106b correspond to different branches of the clock tree associated with the IC 100. Hence, while the first and second clock signals CLK1 and CLK2 are physically different, the first and second clock signals CLK1 and CLK2 are logically equivalent. The second clocking circuit 106b may correspond to a node that is in a higher position (e.g., the first or second layer) of the clock tree. Further, the routing of the first and second clock signals CLK1 and CLK2 is different. This ensures that perturbations in one clock signal are not replicated in the other clock signal. Similarly, in an embodiment, the first reset circuit 108a and the second reset circuit 108b correspond to different branches of a reset tree associated with the IC 100, and hence, the first reset signal RST1 and the second reset signal RST2 are logically equivalent. The second reset circuit 108b may correspond to a node that is in a higher position (e.g., the first or second layer) of the reset tree. Further, the routing of the first and second reset signals RST1 and RST2 is different. This ensures that perturbations in one reset signal are not replicated in the other reset signal. Further, the second clocking circuit 106b and the second reset circuit 108b may be configured to provide the second clock signal CLK2 and the second reset signal RST2 to the fault detection system 104 to enable detection of the glitches in the first clock signal CLK1 and the first reset signal RST1, respectively.

Thus, based on the first and second clock signals CLK1 and CLK2, the first and second reset signals RST1 and RST2, and being present within the predefined distance of the functional system 102, the fault detection system 104 may be configured to detect the fault induced in the IC 100 by the fault injection attack. Examples of the fault injection attack detected by the fault detection system 104 include a power glitching attack, an electromagnetic fault injection attack, a clock glitching attack, a light injection attack, a forward body bias injection attack, or the like. However, in other embodiments, any other type of fault injection attack may be detected, without deviating from the scope of the present disclosure.

The fault detection system 104 may be further configured to output, based on the detection of the fault, a first output bit OT1 and a second output bit OT2 that is an inverted version of the first output bit OT1. In an embodiment, the first output bit OT1 is asserted and the second output bit OT2 is de-asserted to indicate a presence of the fault. Conversely, the first output bit OT1 is de-asserted and the second output bit OT2 is asserted to indicate an absence of the fault. Further, the first output bit OT1 is controlled based on the first clock signal CLK1 and the first reset signal RST1, whereas, the second output bit OT2 is controlled based on the second clock signal CLK2 and the second reset signal RST2. The second output bit OT2 thus acts as a fail-safe in case the first clock signal CLK1 and the first reset signal RST1 are altered due to the fault injection attack.

The security system 110 may be coupled to the fault detection system 104. The security system 110 may include suitable circuitry that may be configured to execute one or more operations. For example, the security system 110 may be configured to receive the first and second output bits OT1 and OT2 from the fault detection system 104. Based on the asserted state of the first output bit OT1 and/or the de-asserted state of the second output bit OT2, the security system 110 may be further configured to execute one or more recovery operations to recover the IC 100. The one or more recovery operations may correspond to a local reset operation, a partition reset operation, a global reset operation, an interrupt generation and error logging operation, or the like. The scope of the present disclosure is not limited to the aforementioned recovery operations. In other embodiments, any other type of recovery operation may be executed, without deviating from the scope of the present disclosure. Further, in one embodiment, the security system 110 may execute the one or more recovery operations in a graded manner (e.g., with rising levels of severity).

Figure 2:
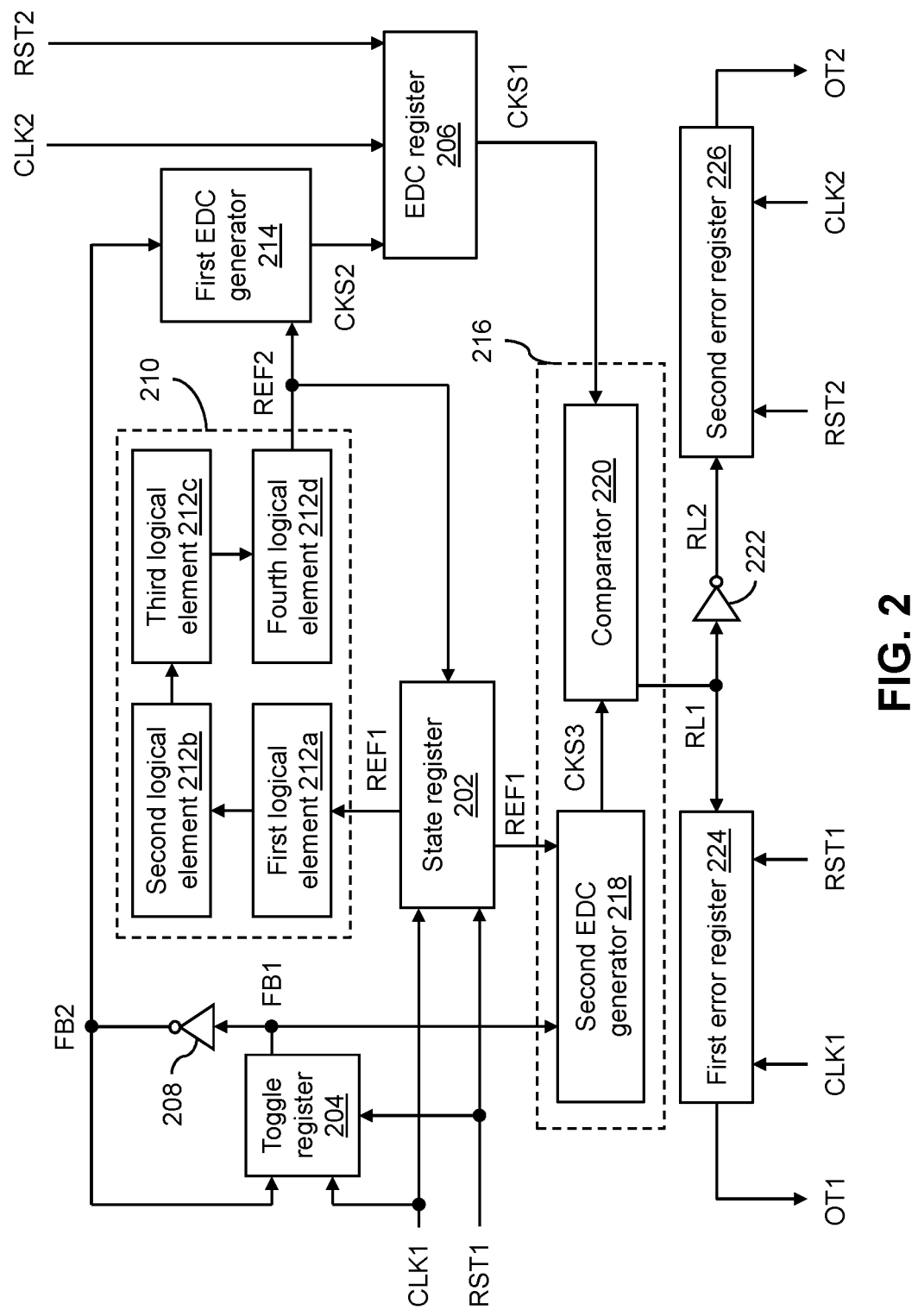
FIG. 2 illustrates a schematic block diagram of a fault detection system of the IC of FIG. 1 in accordance with an embodiment of the present disclosure.

FIG. 2 illustrates a schematic block diagram of the fault detection system 104 in accordance with an embodiment of the present disclosure.

The fault detection system 104 may include a state register 202, a toggle register 204, and an error detection code (EDC) register 206. Each of the state and toggle registers 202 and 204 may be coupled to the first clocking circuit 106a, and configured to receive the first clock signal CLK1 from the first clocking circuit 106a. Thus, each of the state and toggle registers 202 and 204 may be configured to operate in synchronization with the first clock signal CLK1 (e.g., operations of each of the state and toggle registers 202 and 204 are synchronous with the first clock signal CLK1). Similarly, the EDC register 206 may be coupled to the second clocking circuit 106b, and configured to receive the second clock signal CLK2 from the second clocking circuit 106b. Thus, the EDC register 206 may be configured to operate in synchronization with the second clock signal CLK2 (e.g., an operation of the EDC register 206 is synchronous with the second clock signal CLK2).

Each of the state and toggle registers 202 and 204 may be further coupled to the first reset circuit 108a, and configured to receive the first reset signal RST1 from the first reset circuit 108a. The first reset signal RST1 may control reset operations of the state and toggle registers 202 and 204.

Similarly, the EDC register 206 may be further coupled to the second reset circuit 108b, and configured to receive the second reset signal RST2 from the second reset circuit 108b. The second reset signal RST2 may control a reset operation of the EDC register 206. The first and second clock signals CLK1 and CLK2 are logically equivalent and the first and second reset signals RST1 and RST2 are logically equivalent. Hence, during normal operations (e.g., non-attack scenarios) of the IC 100, the state register 202, the toggle register 204, and the EDC register 206 are operating in a synchronous manner.

Each of the state and EDC registers 202 and 206 may include multiple D flip-flops, whereas, the toggle register 204 may include a single D flip-flop. Thus, each of the state and EDC registers 202 and 206 corresponds to multi-bit registers, whereas, the toggle register 204 corresponds to a single-bit register. Examples of the state register 202 include a 16-bit register, a 32-bit register, a 64-bit register, or the like, whereas, examples of the EDC register 206 include a 6-bit register, a 7-bit register, or the like. However, in other embodiments, the number of flip-flops included in the state and EDC registers 202 and 206 may be different.

At a first triggering edge of the first clock signal CLK1, the state and toggle registers 202 and 204 may be further configured to store first reference data REF1 and a first flop bit FB1, respectively. A triggering edge of a clock signal may correspond to a positive edge or a negative edge. Similarly, at a first triggering edge of the second clock signal CLK2, the EDC register 206 may be further configured to store first checksum data CKS1. The first checksum data CKS1 may correspond to a checksum of the first reference data REF1 and the first flop bit FB1. In an example, the first checksum data CKS1 corresponds to a 7-bit checksum of a combination of the 32-bit first reference data REF1 and the first flop bit FB1. Further, during each cycle of the first clock signal CLK1, values stored in the state register 202, the toggle register 204, and the EDC register 206 are utilized for detecting the fault in the IC 100.

The fault detection system 104 may further include a first inverter 208 that may be coupled to the toggle register 204. The first inverter 208 may be configured to receive the first flop bit FB1 from the toggle register 204 at the first triggering edge of the first clock signal CLK1, generate a second flop bit FB2 that is an inverted version of the first flop bit FB1, and update the first flop bit FB1 of the toggle register 204 at a second triggering edge of the first clock signal CLK1 with the second flop bit FB2. The second triggering edge of the first clock signal CLK1 is subsequent to the first triggering edge of the first clock signal CLK1. Thus, at the second triggering edge of the first clock signal CLK1, a logic state of the updated first flop bit FB1 is different from a logic state of the first flop bit FB1 stored in the toggle register 204 between the first and second triggering edges of the first clock signal CLK1.

The fault detection system 104 may further include logic circuitry 210 that may be coupled to the state register 202. The logic circuitry 210 may be configured to receive the first reference data REF1 from the state register 202 at the first triggering edge of the first clock signal CLK1. The logic circuitry 210 may be further configured to execute a logic function based on the first reference data REF1 to iteratively generate second reference data REF2 that is different from the first reference data REF1. The logic function corresponds to a linear feedback shift register function, a matrix multiplication function, a non-linear feedback shift register function, an S-box function, or the like. However, in other embodiments, a different logic function may be utilized, without deviating from the scope of the present disclosure. The logic function may be designed such that the second reference data REF2 of a last iteration is generated before the second triggering edge of the first clock signal CLK1.

The logic circuitry 210 may include a plurality of logical elements that enable the execution of the logic function. In the present disclosure, the plurality of logical elements includes first through fourth logical elements 212a-212d. However, in other embodiments, the number of logical elements may be less than or more than four, without deviating from the scope of the present disclosure. The number of logical elements of the plurality of logical elements is determined based on a frequency of the first clock signal CLK1 and/or a technology node associated with the IC 100. Each logical element is a combinational circuit including multiple short data paths and long data paths. Initially, the shortest data path comprising multiple short data paths of all the logical elements may be traversed to generate the second reference data REF2 of a first iteration. Thus, the generation of the second reference data REF2 of the first iteration is delayed with respect to the first triggering edge of the first clock signal CLK1. Further, with each subsequent iteration, different combinations of short and long data paths of each logical element may be traversed leading to an update of the second reference data REF2. The second reference data REF2 is thus iteratively generated (e.g., updated). Further, at the second triggering edge of the first clock signal CLK1, the logic circuitry 210 may be configured to update the first reference data REF1 of the state register 202 with the corresponding second reference data REF2 (e.g., the second reference data REF2 generated by the logic circuitry 210 at the time instance corresponding to the second triggering edge of the first clock signal CLK1).

The fault detection system 104 may further include a first EDC generator 214 that may be coupled to the logic circuitry 210, the first inverter 208, and the EDC register 206. The first EDC generator 214 may include suitable circuitry that may be configured to execute one or more operations. For example, the first EDC generator 214 may be configured to receive the second reference data REF2 generated during each iteration from the logic circuitry 210 and the second flop bit FB2 from the first inverter 208. Further, the first EDC generator 214 may be configured to iteratively generate second checksum data CKS2 based on the iteratively generated second reference data REF2 and the second flop bit FB2. Thus, the second checksum data CKS2 for each iteration is a checksum of the second reference data REF2 generated by the logic circuitry 210 for the corresponding iteration and the second flop bit FB2 generated by the first inverter 208. In an embodiment, the second checksum data CKS2 corresponds to a 7-bit checksum value. However, a number of data bits of the second checksum data CKS2 may be different in other embodiments.

The first EDC generator 214 may be further configured to update the first checksum data CKS1 of the EDC register 206 at a second triggering edge of the second clock signal CLK2 with the corresponding second checksum data CKS2 (e.g., the second checksum data CKS2 generated by the first EDC generator 214 at the time instance corresponding to the second triggering edge of the second clock signal CLK2). The second triggering edge of the second clock signal CLK2 is subsequent to the first triggering edge of the second clock signal CLK2.

Thus, at the first triggering edge of the first clock signal CLK1, the state and toggle registers 202 and 204 store the first reference data REF1 and the first flop bit FB1, respectively, and at the first triggering edge of the second clock signal CLK2, the EDC register 206 stores the first checksum data CKS1. Between the first and second triggering edges of each of the first and second clock signals CLK1 and CLK2, the first inverter 208 generates the second flop bit FB2, the logic circuitry 210 executes the logic function to iteratively generate the second reference data REF2, and the first EDC generator 214 iteratively generates the second checksum data CKS2 based on the second flop bit FB2 and the iteratively generated second reference data REF2. Further, at the second triggering edge of the first clock signal CLK1, the first reference data REFI of the state register 202 is updated with the corresponding second reference data REF2 and the first flop bit FB1 of the toggle register 204 is updated with the second flop bit FB2. Similarly, at the second triggering edge of the second clock signal CLK2, the first checksum data CKS1 of the EDC register 206 is updated with the corresponding second checksum data CKS2. The updated first flop bit FB1 of the toggle register 204, the updated first reference data REF1 of the state register 202, and the updated first checksum data CKS1 of the EDC register 206 are utilized to detect the fault in the IC 100. The fault may be detected after the second triggering edge of each of the first and second clock signals CLK1 and CLK2.

The fault detection system 104 may further include an EDC checker 216 that may be coupled to the state register 202, the toggle register 204, and the EDC register 206. The EDC checker 216 may be configured to retrieve the updated first reference data REF1 from the state register 202, the updated first flop bit FB1 from the toggle register 204, and the updated first checksum data CKS1 from the EDC register 206. Based on the updated first flop bit FB1, the updated first reference data REF1, and the updated first checksum data CKS1, the EDC checker 216 may be further configured to detect the fault in the IC 100. The EDC checker 216 may include a second EDC generator 218 and a comparator 220.

The second EDC generator 218 may be coupled to the state and toggle registers 202 and 204. The second EDC generator 218 may include suitable circuitry that may be configured to execute one or more operations. For example, the second EDC generator 218 may be configured to retrieve the updated first reference data REF1 and the updated first flop bit FB1 from the state and toggle registers 202 and 204, respectively, and generate third checksum data CKS3 based on the updated first reference data REF1 and the updated first flop bit FB1. The third checksum data CKS3 is thus a checksum of the updated first reference data REF1 and the updated first flop bit FB1.

The comparator 220 may be coupled to the second EDC generator 218 and the EDC register 206. The comparator 220 may include suitable circuitry that may be configured to execute one or more operations. For example, the comparator 220 may be configured to receive the third checksum data CKS3 from the second EDC generator 218 and retrieve the updated first checksum data CKS1 from the EDC register 206. Further, the comparator 220 may be configured to compare the updated first checksum data CKS1 and the third checksum data CKS3 and detect the fault in the IC 100 based on a mismatch between the updated first checksum data CKS1 and the third checksum data CKS3. The presence of the fault in the IC 100 is indicative of the fault injection attack on the IC 100.

Thus, during the normal operations of the IC 100, the updated first checksum data CKS1 matches the third checksum data CKS3. However, in case of the fault injection attack, various perturbations may be experienced in the fault detection system 104. In one scenario, the first and second clock signals CLK1 and CLK2 may not be synchronous, resulting in different sampling of the state and toggle registers 202 and 204 and the EDC register 206. In another scenario, one or both of the second reference data REF2 and the second checksum data CKS2 may be togging during the set-up-and-hold time of the first and second clock signals CLK1 and CLK2. In both the aforementioned scenarios, the updated first checksum data CKS1 may not be a checksum of the updated first flop bit FB1 and the updated first reference data REF1. Thus, the updated first checksum data CKS1 may not match the third checksum data CKS3. The fault detection system 104 thus enables the detection of the fault in the IC 100.

The comparator 220 may be further configured to generate a first result bit RL1 based on the comparison of the updated first checksum data CKS1 and the third checksum data CKS3. In an embodiment, the first result bit RL1 is asserted based on the mismatch between the updated first checksum data CKS1 and the third checksum data CKS3 and de-asserted based on a match between the updated first checksum data CKS1 and the third checksum data CKS3.

The fault detection system 104 may further include a second inverter 222 that may be coupled to the comparator 220. The second inverter 222 may be configured to receive the first result bit RL1 from the comparator 220 and generate a second result bit RL2 that is an inverted version of the first result bit RL1.

The fault detection system 104 may further include a first error register 224 and a second error register 226. Each of the first and second error registers 224 and 226 may include a single D flip-flop. Thus, each of the first and second error registers 224 and 226 corresponds to a single-bit register. The first error register 224 may be coupled to the first clocking circuit 106a, the first reset circuit 108a, the comparator 220, and the security system 110. Similarly, the second error register 226 may be coupled to the second clocking circuit 106b, the second reset circuit 108b, the second inverter 222, and the security system 110.

The first and second error registers 224 and 226 may be configured to receive the first and second clock signals CLK1 and CLK2 from the first and second clocking circuits 106a and 106b, respectively. Thus, the first and second error registers 224 and 226 may be configured to operate in synchronization with the first and second clock signals CLK1 and CLK2, respectively. Additionally, the first and second error registers 224 and 226 may be configured to receive the first and second reset signals RST1 and RST2 from the first and second reset circuits 108a and 108b, respectively. The first and second reset signals RST1 and RST2 may control reset operations of the first and second error registers 224 and 226, respectively. The first and second clock signals CLK1 and CLK2 are logically equivalent and the first and second reset signals RST1 and RST2 are logically equivalent. Hence, during normal operations of the IC 100, the first and second error registers 224 and 226 operate in a synchronous manner.

The first and second error registers 224 and 226 may be configured to store the first and second output bits OT1 and OT2, respectively. At the first and second triggering edges of each of the first and second clock signals CLK1 and CLK2, the first and second output bits OT1 and OT2 may have various intermediate values. For the sake of ongoing discussion, it is assumed that the first output bit OT1 is de-asserted and the second output bit OT2 is asserted. At a third triggering edge of the first clock signal CLK1, the comparator 220 may be further configured to update the first output bit OT1 of the first error register 224 with the first result bit RL1 generated after the second triggering edge of the first clock signal CLK1. The third triggering edge of the first clock signal CLK1 is subsequent to the second triggering edge of the first clock signal CLK1. Similarly, at a third triggering edge of the second clock signal CLK2, the second inverter 222 may be further configured to update the second output bit OT2 of the second error register 226 with the second result bit RL2 generated after the second triggering edge of the second clock signal CLK2. The third triggering edge of the second clock signal CLK2 is subsequent to the second triggering edge of the second clock signal CLK2. Thus, after the second triggering edge, if the updated first checksum data CKS1 is different from the checksum of the updated first flop bit FB1 and the updated first reference data REF1, the first output bit OT1 is asserted and the second output bit OT2 is de-asserted at the third triggering edge of the first and second clock signals CLK1 and CLK2, respectively.

The first and second error registers 224 and 226 may be further configured to output and provide the first and second output bits OT1 and OT2 to the security system 110 at each triggering edge of the first and second clock signals CLK1 and CLK2, respectively. Thus, the one or more recovery operations associated with the detected fault are executed based on the first output bit OT1 (e.g., the asserted state of the first output bit OT1) and/or the second output bit OT2 ((e.g., the de-asserted state of the second output bit OT2).

The second error register 226 is utilized as a fail-safe to prevent false negatives in case of the glitches in the first clock signal CLK1 and the first reset signal RST1. For example, if the first clock signal CLK1 and the first reset signal RST1 are altered due to the fault injection attack, the first output bit OT1 may be inaccurate. However, as the second error register 226 is controlled by way of the second clock signal CLK2 and the second reset signal RST2, the second error register 226 may operate accurately, thereby ensuring the accurate operation of the fault detection system 104. In such a scenario, while the first output bit OT1 may be de-asserted indicating the absence of the fault, the second output bit OT2 may accurately be de-asserted to indicate the presence of the fault in the IC 100. In an embodiment, the same logic states of the first and second output bits OT1 and OT2 are indicative of the presence of the fault in the IC 100.

Although not shown, the security system 110 may be further configured to retrieve the updated first reference data REFI from the state register 202. Thus, the security system 110 may further utilize the updated first reference data REF1 to execute the one or more recovery operations.

One sequence of operations spanned across three triggering edges is explained above. Similar operations may be executed at various different triggering edges, without deviating from the scope of the present disclosure.

Although it is described that the toggle register 204 is a single-bit register, the scope of the present disclosure is not limited to it. In other embodiments, the toggle register 204 may be a multi-bit register, without deviating from the scope of the present disclosure.

Although it is described that the first and second clock signals CLK1 and CLK2 and the first and second reset signals RST1 and RST2 are logically equivalent but physically separate signals, the scope of the present disclosure is not limited to it. In other embodiments, the same clock signal and the same reset signal may be provided to all the registers, without deviating from the scope of the present disclosure.

In the fault detection system 104, a path encompassing the state register 202, the logic circuitry 210, the first EDC generator 214, and the EDC register 206 corresponds to a critical path of the fault detection system 104 and is utilized to detect the fault in the IC 100. However, a time period associated with the critical path (e.g., a time duration required for the second reference data REF2 and the second checksum data CKS2 to converge, i.e., a time duration required for the second reference data REF2 of the last iteration and the second checksum data CKS2 of the last iteration to be accurately generated) may be greater than a time period of the first clock signal CLK1 experiencing glitches. Hence, a short path encompassing the toggle register 204 and the first inverter 208 is included in the fault detection system 104 to capture glitches in the first clock signal CLK1. Thus, the implementation of the short path increases the sensitivity of the fault detection system 104. The operation of the fault detection system 104 is explained in detail in conjunction with FIG. 3.

Figure 3:
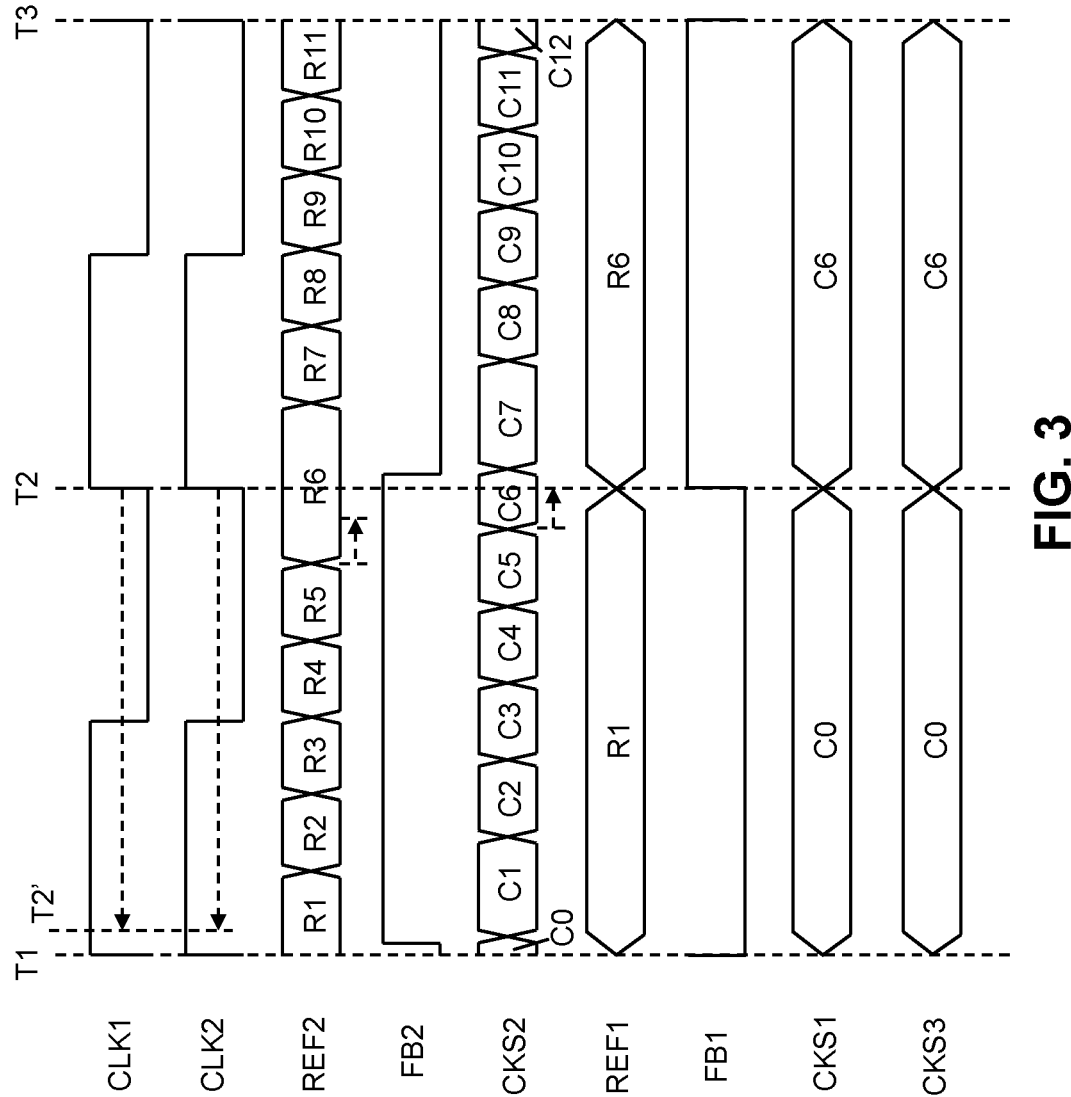
FIG. 3 is a timing diagram that illustrates an operation of the fault detection system in accordance with an embodiment of the present disclosure.
Figure 3:

FIG. 3 is a timing diagram 300 that illustrates the operation of the fault detection system 104 in accordance with an embodiment of the present disclosure.

At time instance T1, the first and second clock signals CLK1 and CLK2 transition from the de-asserted state to the asserted state. For the sake of ongoing discussion, it is assumed that a positive edge of a clock signal is the triggering edge. Thus, the positive edges of the first and second clock signals CLK1 and CLK2 at the time instance T1 correspond to the first triggering edges of the first and second clock signals CLK1 and CLK2, respectively. Further, at the time instance T1, the second reference data REF2 has a value R1, the output of the first inverter 208 (e.g., the second flop bit FB2) is de-asserted, and the second checksum data CKS2 has a value C0 that is a checksum of the value R1 and the de-asserted second flop bit FB2. As a result, at the time instance T1, the first reference data REF1 is updated with the value R1, the first flop bit FB1 is de-asserted, and the first checksum data CKS1 is updated with the value CO. The second EDC generator 218 generates the third checksum data CKS3 based on the value R1 and the de-asserted first flop bit FB1. and hence, the third checksum data CKS3 has the value C0. As the third checksum data CKS3 matches the updated first checksum data CKS1, the first result bit RL1 is de-asserted and the second result bit RL2 is asserted to indicate the absence of the fault in the IC 100. The generation of the third checksum data CKS3, the first result bit RL1, and the second result bit RL2 may be delayed with respect to the first triggering edge of the first clock signal CLK1 due to propagation delays introduced by the second EDC generator 218, the comparator 220, and the second inverter 222. Further, at the time instance T1, the first and second output bits OT1 and OT2 may be updated based on the first and second result bits RL1 and RL2 of the previous clock cycle, respectively.

During a time period T1-T2 (e.g., during a clock cycle of each of the first and second clock signals CLK1 and CLK2), the second flop bit FB2 transitions from the de-asserted state to the asserted state. The transition is delayed with respect to the first triggering edge of the first clock signal CLK1 due to propagation delays introduced by the first inverter 208. Further, the second reference data REF2 is iteratively updated. Thus, after the first iteration, the second reference data REF2 has a value R2. As illustrated in FIG. 3, the update of the second reference data REF2 is delayed with respect to the first triggering edge of the first clock signal CLK1 due to the delay introduced by each logical element of the logic circuitry 210. Thus, when the second flop bit FB2 transitions, the second reference data REF2 still has the value R1. The second checksum data CKS2 is then updated to a value C1 that is a checksum of the value R1 and the asserted second flop bit FB2. Further, when the second reference data REF2 is updated to the value R2 and the second flop bit FB2 is asserted, the second checksum data CKS2 is further updated to a value C2 that is a checksum of the value R2 and the asserted second flop bit FB2. As illustrated in FIG. 3, the update of the second checksum data CKS2 is delayed with respect to the update of the second reference data REF2 and the second flop bit FB2 due to propagation delay introduced by the first EDC generator 214.

The iterative generation of the second reference data REF2 continues and results in the second reference data REF2 being updated to a value R3, a value R4, a value R5, and a value R6 in a sequential manner. Consequently, the second checksum data CKS2 is updated to a value C3, a value C4, a value C5, and a value C6 in a sequential manner. Further, the second reference data REF2 converges (e.g., settles) to the value R6 and the second checksum data CKS2 converges to the value C6 before the time instance T2. The value R6 of the second reference data REF2 and the value C6 of the second checksum data CKS2 correspond to the last iteration values. The time instance T2 corresponds to the second triggering edge of each of the first and second clock signals CLK1 and CLK2. Thus, the second reference data REF2 of the last iteration and the second checksum data of the last iteration are generated before the second triggering edge of each of the first and second clock signals CLK1 and CLK2. The first reference data REF1, the first flop bit FB1, and the second and third checksum data CKS2 and CKS3 remain unchanged during the time period T1-T2.

At time instance T2, the first and second clock signals CLK1 and CLK2 transition from the de-asserted state to the asserted state. The second reference data REF2 has the value R6, the second flop bit FB2 is asserted, and the second checksum data CKS2 has the value C6 that is a checksum of the value R6 and the asserted second flop bit FB2. As a result, at the time instance T2, the first reference data REF1 has the value R6, the first flop bit FB1 is asserted, and the first checksum data CKS1 has the value C6. The second EDC generator 218 generates the third checksum data CKS3 based on the value R6 and the asserted first flop bit FB1, and hence, the third checksum data CKS3 has the value C6. As a result, the first result bit RL1 is de-asserted and the second result bit RL2 is asserted to indicate the absence of the fault in the IC 100. Further, at the time instance T2, the first and second output bits OT1 and OT2 may be updated based on the first and second result bits RL1 and RL2 of the previous clock cycle, respectively.

During a time period T2-T3, the second flop bit FB2 transitions from the asserted state to the de-asserted state. When the second flop bit FB2 transitions, the second reference data REF2 still has the value R6. The second checksum data CKS2 is thus updated to a value C7 that is a checksum of the value R6 and the de-asserted second flop bit FB2. Further, the second reference data REF2 is iteratively updated to a value R7, a value R8, a value R9, a value R10, and a value R11 in a sequential manner. Consequently, the second checksum data CKS2 is updated to a value C8, a value C9, a value C10, a value C11, and a value C12 in a sequential manner. Further, the second reference data REF2 converges to the value R11 and the second checksum data CKS2 converges to the value C12 before the time instance T3. The time instance T3 corresponds to the third triggering edge of each of the first and second clock signals CLK1 and CLK2. The first reference data REF1, the first flop bit FB1, and the second and third checksum data CKS2 and CKS3 remain unchanged during the time period T2-T3.

The first and second result bits RL1 and RL2 generated during the time period T2-T3 are utilized to update the first and second output bits OT1 and OT2 at the time instance T3, respectively. Thus, if the second triggering edge of each of the first and second clock signals CLK1 and CLK2 is considered as a reference triggering edge, the first triggering edge of each of the first and second clock signals CLK1 and CLK2 corresponds to a previous triggering edge that precedes the reference triggering edge and the third triggering edge of each of the first and second clock signals CLK1 and CLK2 corresponds to a subsequent triggering edge that is subsequent to the reference triggering edge.

The timing diagram 300 illustrates one example of the operation of the fault detection system 104 and the scope of the present disclosure is not limited to it.

The above-mentioned values of different data and data bits are during the normal operations (e.g., non-attack scenarios) of the IC 100. However, during the fault injection attack, various variations may occur. A few examples of such variations are illustrated with dotted arrows in FIG. 3.

In one scenario, the fault injection attack on the IC 100 may increase delays introduced by the logic circuitry 210. Thus, during the time period T1-T2, the time instance at which the second reference data REF2 converges to the value R6 may be closer to the time instance T2. Consequently, the second checksum data CKS2 may be toggling at the second triggering edge of the second clock signal CLK2. As a result, the checksum value stored in the EDC register 206 at the second triggering edge of the second clock signal CLK2 may be different from the value C6. However, as the second reference data REF2 is settled to the value R6, the third checksum data CKS3 generated by the second EDC generator 218 may have the value C6. Thus, the third checksum data CKS3 is different from the updated first checksum data CKS1. As a result, the first result bit RL1 may be asserted, and the asserted first output bit OT1 may be provided to the security system 110 at the time instance T3.

In another scenario, the fault injection attack on the IC 100 may result in one or both of the first and second clock signals CLK1 and CLK2 experiencing variations in the time period. The variation may be such that the time period drastically reduces. For example, the time period T1-T2 is reduced to less than the initial delay introduced by the logic circuitry 210. In such cases, at the altered time instance T2', the first and second reference data REF1 and REF2 remain unchanged (e.g., has the value R1). The toggle register 204 and the first inverter 208 are included in the fault detection system 104 to detect such faults. For example, the second flop bit FB2 is asserted before the altered time instance T2', however, the delay of the first EDC generator 214 results in the second checksum data CKS2 updating after the altered time instance T2'. Thus, at the altered time instance T2', the first flop bit FB1 is asserted and the first reference data REF1 has the value R1. Consequently, the third checksum data CKS3 generated by the second EDC generator 218 has the value C1 that is the checksum of the value R1 and the asserted first flop bit FB1. However, as the second checksum data CKS2 is updated to the value C1 after the altered time instance T2', the first checksum data CKS1 remains at the value C0 at the altered time instance T2'. Thus, the third checksum data CKS3 is different from the updated first checksum data CKS1. As a result, the first result bit RL1 may be asserted, and the asserted first output bit OT1 may be provided to the security system 110 at the time instance T3.

The scope of the present disclosure is not limited to the two scenarios described above. Various other variations may be induced by the fault injection attack, without deviating from the scope of the present disclosure. For example, a variation in exclusively one clock signal may result in different sampling periods for the state and toggle registers 202 and 204 and the EDC register 206, thereby leading to the third checksum data CKS3 being different from the updated first checksum data CKS1. The first and second reset signals RST1 and RST2 are also similarly utilized to ensure the accurate operation of the fault detection system 104.

Figure 4B:
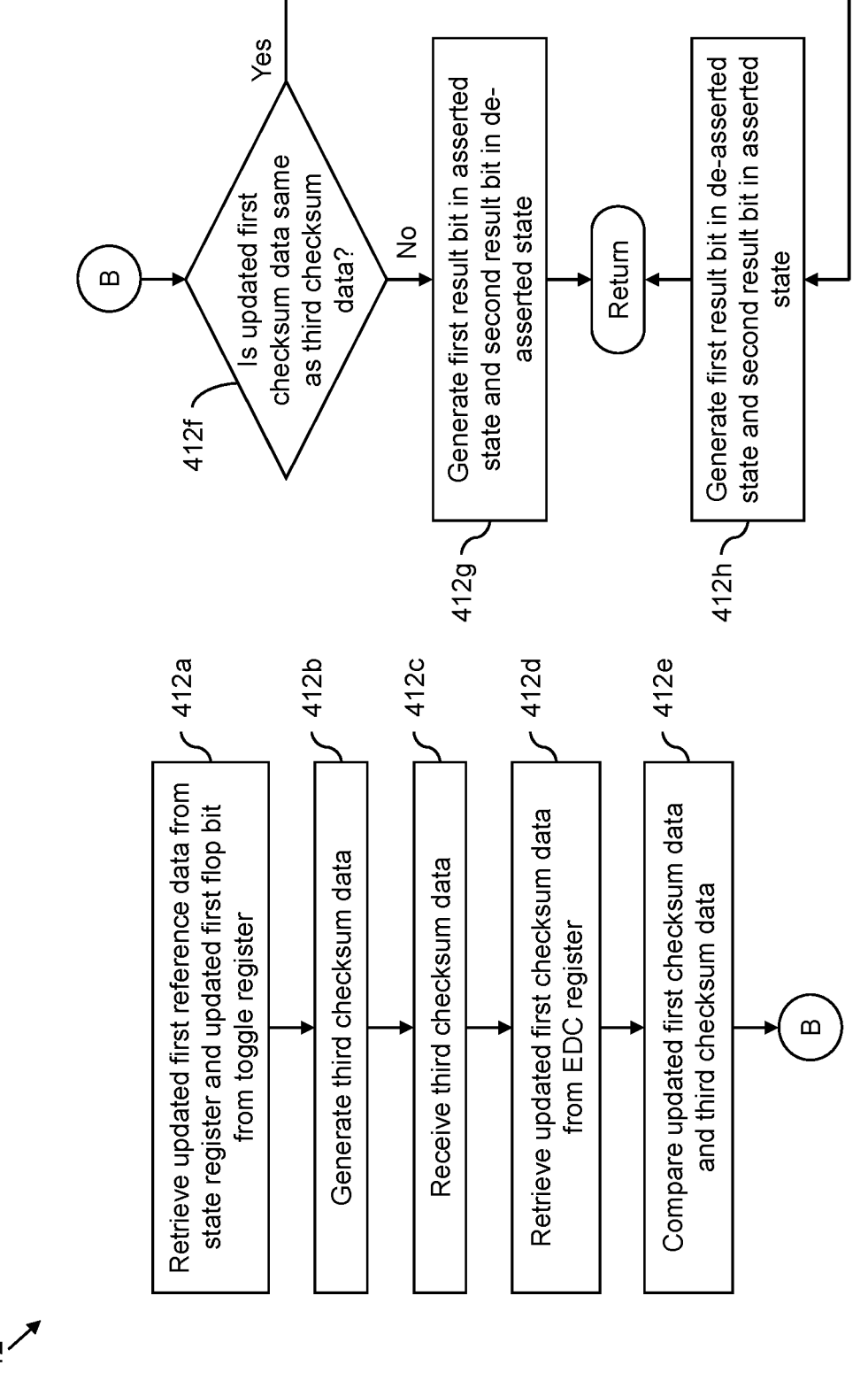

FIGS. 4A and 4B, collectively, represent a flowchart 400 that illustrates a fault detection method in accordance with an embodiment of the present disclosure. Referring to FIG. 4A, at step 402, the state and toggle registers 202 and 204 may store the first reference data REF1 and the first flop bit FB1, respectively, at the first triggering edge of the first clock signal CLK1, and the EDC register 206 may store the first checksum data CKS1 at the first triggering edge of the second clock signal CLK2. At step 404, the first inverter 208 may generate the second flop bit FB2. At step 406, the logic circuitry 210 may execute the logic function based on the first reference data REF1 to iteratively generate the second reference data REF2. At step 408, the first EDC generator 214 may iteratively generate the second checksum data CKS2 such that the second checksum data CKS2 for each iteration is the checksum of the second flop bit FB2 and the second reference data REF2 of the corresponding iteration. Steps 404-408 may be executed between the first and second triggering edges of each of the first and second clock signals CLK1 and CLK2.

At step 410, the logic circuitry 210 may update the first reference data REF1 of the state register 202 at the second triggering edge of the first clock signal CLK1 with the corresponding second reference data REF2, the first inverter 208 may update the first flop bit FB1 of the toggle register 204 at the second triggering edge of the first clock signal CLK1 with the second flop bit FB2, and the first EDC generator 214 may update the first checksum data CKS1 of the EDC register 206 at the second triggering edge of the second clock signal CLK2 with the corresponding second checksum data CKS2. At step 412, the EDC checker 216 may detect the fault in the IC 100 based on the updated first flop bit FB1 of the toggle register 204, the updated first reference data REF1 of the state register 202, and the updated first checksum data CKS1 of the EDC register 206.

Referring to FIG. 4B, at step 412a, the second EDC generator 218 may retrieve the updated first reference data REF1 from the state register 202 and the updated first flop bit FB1 from the toggle register 204. At step 412b, the second EDC generator 218 may generate the third checksum data CKS3 based on the updated first reference data REF1 and the updated first flop bit FB1. At step 412c, the comparator 220 may receive the third checksum data CKS3 from the second EDC generator 218. At step 412d, the comparator 220 may retrieve the updated first checksum data CKS1 from the EDC register 206. At step 412e. the comparator 220 may compare the updated first checksum data CKS1 and the third checksum data CKS3. At step 412f, the comparator 220 may determine whether the updated first checksum data CKS1 is the same as the third checksum data CKS3.

If at step 412f, the comparator 220 determines that the updated first checksum data CKS1 is not the same as the third checksum data CKS3, step 412g is executed. At step 412g, the comparator 220 may generate the first result bit RL1 in the asserted state and the second inverter 222 may generate the second result bit RL2 in the de-asserted state. The asserted first result bit RL1 and the de-asserted second result bit RL2 are indicative of the presence of the fault in the IC 100. Conversely, if at step 412f, the comparator 220 determines that the updated first checksum data CKS1 is the same as the third checksum data CKS3, step 412h is executed. At step 412h, the comparator 220 may generate the first result bit RL1 in the de-asserted state and the second inverter 222 may generate the second result bit RL2 in the asserted state. The de-asserted first result bit RL1 and the asserted second result bit RL2 are indicative of the absence of the fault in the IC 100.

Referring back to FIG. 4A, at step 414, the comparator 220 and the second inverter 222 may update the first and second output bits OT1 and OT2 of the first and second error registers 224 and 226 with the first and second result bits RL1 and RL2, respectively. The first and second output bits OT1 and OT2 of the first and second error registers 224 and 226 may be updated at the third triggering edges of the first and second clock signals CLK1 and CLK2, respectively.

Thus, for any type of fault injection attack (e.g., a power glitching attack, an electromagnetic fault injection attack, a clock glitching attack, a light injection attack, a forward body bias injection attack, or the like) on the IC 100, the updated first checksum data CKS1 does not match the third checksum data CKS3. As a result, the fault detection system 104 is capable of detecting more types of fault injection attacks than a conventional fault detection system that is capable of detecting exclusively the power glitching attacks. Further, to detect the fault injection attack on the functional system 102, the fault detection system 104 is merely placed within the predefined distance of the functional system 102 and the functional system 102 is not required to be modified. As a result, the complexity of the IC 100 is less than that of an IC that includes the conventional fault detection system. Additionally, the components of the fault detection system 104 are digital components that occupy a significantly lesser area on the IC 100 as compared to that occupied by analog components of the conventional fault detection system. Consequently, a significantly greater number of fault detection systems may be included in the IC 100. Thus, the fault coverage provided in the IC 100 is significantly greater than that in the IC that includes the conventional fault detection system.

In the present disclosure, the term "assert" is used to mean placing a signal in an active state. For example, for an active-low signal, the signal is at a logic low state when asserted, and for an active-high signal, the signal is at a logic high state when asserted.

In an embodiment of the present disclosure, the IC 100 is disclosed. The IC 100 may include a fault detection system 104. The fault detection system 104 may include the state register 202 and the EDC register 206 configured to operate in synchronization with the first and second clock signals CLK1 and CLK2, respectively. The state and EDC registers 202 and 206 may be further configured to store the first reference data REF1 and the first checksum data CKS1, respectively. The fault detection system 104 may further include the logic circuitry 210 that may be coupled to the state register 202. The logic circuitry 210 may be configured to execute the logic function based on the first reference data REF1 to iteratively generate the second reference data REF2 that is different from the first reference data REF1. Further, the logic circuitry 210 may be configured to update the first reference data REF1 of the state register 202 at the reference triggering edge (e.g., the second triggering edge) of the first clock signal CLK1 with the corresponding second reference data REF2. The fault detection system 104 may further include the first EDC generator 214 that may be coupled to the logic circuitry 210 and the EDC register 206. The first EDC generator 214 may be configured to iteratively generate the second checksum data CKS2 such that the second checksum data CKS2 for each iteration is generated based on the second reference data REF2 generated for the corresponding iteration. Further, the first EDC generator 214 may be configured to update the first checksum data CKS1 of the EDC register 206 at the reference triggering edge (e.g., the second triggering edge) of the second clock signal CLK2 with the corresponding second checksum data CKS2. The fault detection system 104 may further include the EDC checker 216 that may be coupled to the state and EDC registers 202 and 206. The EDC checker 216 may be configured to detect the fault in the IC 100 based on the updated first reference data REF1 and the updated first checksum data CKS1.

In another embodiment of the present disclosure, a method is disclosed. The method includes storing the first reference data REF1 and the first checksum data CKS1 by the state register 202 and the EDC register 206, respectively. The operation of the state register 202 is synchronous with the first clock signal CLK1 and the operation of the EDC register 206 is synchronous with the second clock signal CLK2. The method further includes executing the logic function based on the first reference data REFI by the logic circuitry 210 to iteratively generate the second reference data REF2 that is different from the first reference data REF1. Further, the method includes iteratively generating the second checksum data CKS2 by the first EDC generator 214. The second checksum data CKS2 for each iteration is generated based on the second reference data REF2 generated for the corresponding iteration. The method further includes updating the first reference data REF1 of the state register 202 at the reference triggering edge of the first clock signal CLK1 by the logic circuitry 210 with the corresponding second reference data REF2, and updating the first checksum data CKS1 of the EDC register 206 at the reference triggering edge of the second clock signal CLK2 by the first EDC generator 214 with the corresponding second checksum data CKS2. Further, the method includes detecting the fault in the IC 100 by the EDC checker 216 based on the updated first reference data REF1 and the updated first checksum data CKS1.

In some embodiments, the EDC checker 216 may include the second EDC generator 218 that may be coupled to the state register 202, and the comparator 220 that may be coupled to the second EDC generator 218 and the EDC register 206. The second EDC generator 218 may be configured to retrieve the updated first reference data REF1 from the state register 202 and generate the third checksum data CKS3 based on the updated first reference data REF1. The comparator 220 may be configured to receive the third checksum data CKS3 from the second EDC generator 218 and retrieve the updated first checksum data CKS1 from the EDC register 206. Further, the comparator 220 may be configured to compare the updated first checksum data CKS1 and the third checksum data CKS3 and detect the fault in the IC 100 based on the mismatch between the updated first checksum data CKS1 and the third checksum data CKS3.

In some embodiments, the fault detection system 104 may further include the toggle register 204 and the first inverter 208 that may be coupled to the toggle register 204. The toggle register 204 may be configured to operate in synchronization with the first clock signal CLK1 and store the first flop bit FB1. The first inverter 208 may be configured to generate the second flop bit FB2 that is an inverted version of the first flop bit FB1 and update the first flop bit FB1 of the toggle register 204 at the reference triggering edge of the first clock signal CLK1 with the second flop bit FB2.

In some embodiments, the first EDC generator 214 may be further coupled to the first inverter 208, and configured to receive the second flop bit FB2. The first EDC generator 214 may iteratively generate the second checksum data CKS2 further based on the second flop bit FB2 such that the second checksum data CKS2 for each iteration may be the checksum of the second reference data REF2 generated for the corresponding iteration and the second flop bit FB2. The second EDC generator 218 may be further coupled to the toggle register 204, and configured to retrieve the updated first flop bit FB1 from the toggle register 204. The second EDC generator 218 may generate the third checksum data CKS3 further based on the updated first flop bit FBI such that the third checksum data CKS3 may be the checksum of the updated first reference data REF1 and the updated first flop bit FB1.

In some embodiments, at the previous triggering edge (e.g., the first triggering edge) of the first clock signal CLK1, the state and toggle registers 202 and 204 may store the first reference data REF1 and the first flop bit FB1, respectively, and at the previous triggering edge (e.g., the first triggering edge) of the second clock signal CLK2, the EDC register 206 may store the first checksum data CKS1. The previous triggering edge of the first clock signal CLK1 precedes the reference triggering edge of the first clock signal CLK1 and the previous triggering edge of the second clock signal CLK2 precedes the reference triggering edge of the second clock signal CLK2. Further, between the previous triggering edge and the reference triggering edge of each of the first and second clock signals CLK1 and CLK2, the first inverter 208 may generate the second flop bit FB2, the logic circuitry 210 may execute the logic function to iteratively generate the second reference data REF2, and the first EDC generator 214 may iteratively generate the second checksum data CKS2 based on the second flop bit FB2 and the iteratively generated second reference data REF2. At the reference triggering edge of the first clock signal CLK1, the first reference data REF1 of the state register 202 may be updated with the corresponding second reference data REF2 and the first flop bit FB1 of the toggle register 204 may be updated with the second flop bit FB2. Further, at the reference triggering edge of the second clock signal CLK2, the first checksum data CKS1 of the EDC register 206 may be updated with the corresponding second checksum data CKS2.

In some embodiments, the comparator 220 may be further configured to generate the first result bit RL1 based on the comparison of the updated first checksum data CKS1 and the third checksum data CKS3. The first result bit RL1 may be asserted based on the mismatch between the updated first checksum data CKS1 and the third checksum data CKS3 and de-asserted based on a match between the updated first checksum data CKS1 and the third checksum data CKS3.

In some embodiments, the fault detection system 104 may further include the first error register 224 that may be coupled to the comparator 220. The first error register 224 may be configured to store the first output bit OT1. The comparator 220 may be further configured to update the first output bit OT1 of the first error register 224 with the first result bit RL1 at the subsequent triggering edge (e.g., the third triggering edge) of the first clock signal CLK1. The subsequent triggering edge of the first clock signal CLK1 is subsequent to the reference triggering edge of the first clock signal CLK1. The one or more recovery operations associated with the detected fault may be executed based on the first output bit OT1.

In some embodiments, the fault detection system 104 may further include the second error register 226 and the second inverter 222 that may be coupled to the comparator 220 and the second error register 226. The second error register 226 may be configured to store the second output bit OT2. The second inverter 222 may be configured to generate the second result bit RL2 that is the inverted version of the first result bit RL1 and update the second output bit OT2 of the second error register 226 with the second result bit RL2 at the subsequent triggering edge (e.g., the third triggering edge) of the second clock signal CLK2. The subsequent triggering edge of the second clock signal CLK2 is subsequent to the reference triggering edge of the second clock signal CLK2. The one or more recovery operations associated with the detected fault may be executed based on the second output bit OT2.

In some embodiments, the presence of the fault in the IC 100 is indicative of the fault injection attack on the IC 100.

In some embodiments, the fault injection attack may correspond to at least one of a group consisting of a power glitching attack, a clock glitching attack, an electromagnetic fault injection attack, a light injection attack, and a forward body bias injection attack.

In some embodiments, the second reference data REF2 of the last iteration is generated before the reference triggering edge of each of the first and second clock signals CLK1 and CLK2.

In some embodiments, the IC 100 may further include the first and second clocking circuits 106*a* and 106*b* that may be configured to generate the first and second clock signals CLK1 and CLK2, respectively. The first and second clock signals CLK1 and CLK2 are logically equivalent. The first and second clocking circuits 106*a* and 106*b* may correspond to different branches of the clock tree associated with the IC 100.

In some embodiments, the IC 100 may further include the functional system 102 that may be configured to execute the one or more critical operations associated with the IC 100. The fault detection system 104 may be present within the predefined distance of the functional system 102 to enable detection of the fault injection attack on the functional system 102.

In some embodiments, the IC 100 may further include first and second reset circuits 108*a* and 108*b* that may be configured to generate first and second reset signals RST1 and RST2, respectively. The first and second reset signals RST1 and RST2 are logically equivalent. The first reset signal RST1 may control the reset operation of the state register 202 and the second reset signal RST2 may control the reset operation of the EDC register 206. The first and second reset circuits 108*a* and 108*b* may correspond to different branches of the reset tree associated with the IC 100.

In some embodiments, the logic circuitry 210 may include the plurality of logical elements (e.g., the first through fourth logical elements 212*a*-212*d*) that enable the execution of the logic function. The number of logical elements of the plurality of logical elements is determined based on at least one of a group consisting of the frequency of the first clock signal CLK1 and the technology node associated with the IC 100.

In some embodiments, the logic function may correspond to at least one of a group consisting of a linear feedback shift register function, a matrix multiplication function, a nonlinear feedback shift register function, and an S-box function.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC) comprising:

a fault detection system that comprises:

a state register configured to operate in synchronization with a first clock signal and to store first reference data;

an error detection code (EDC) register configured to operate in synchronization with a second clock signal and to store first checksum data;

logic circuitry coupled to the state register and configured to execute a logic function based on the first reference data to iteratively generate second reference data that is different from the first reference data, the logic circuitry configured to update the first reference data of the state register at a reference triggering edge of the first clock signal with the corresponding second reference data;

a first EDC generator coupled to the logic circuitry and the EDC register and configured to iteratively generate second checksum data such that the second checksum data is generated for each iteration based on the second reference data generated for the corresponding iteration, the first EDC generator configured to update the first checksum data of the EDC register at a reference triggering edge of the second clock signal with the corresponding second checksum data; and an EDC checker coupled to the state register and the EDC register, the EDC checker configured to detect a fault in the IC based on the updated first reference data and the updated first checksum data.

2. The IC of claim 1, wherein the EDC checker comprises:

a second EDC generator that is coupled to the state register, and configured to retrieve the updated first reference data from the state register and generate third checksum data based on the updated first reference data; and a comparator that is coupled to the second EDC generator and the EDC register, and configured to receive the third checksum data from the second EDC generator, retrieve the updated first checksum data from the EDC register, compare the updated first checksum data and the third checksum data, and detect the fault in the IC based on a mismatch between the updated first checksum data and the third checksum data.

3. The IC of claim 2, wherein the fault detection system further comprises:

a toggle register that is configured to operate in synchronization with the first clock signal and store a first flop bit; and a first inverter that is coupled to the toggle register, and configured to generate a second flop bit that is an inverted version of the first flop bit and update the first flop bit of the toggle register at the reference triggering edge of the first clock signal with the second flop bit.

4. The IC of claim 3, wherein the first EDC generator is further coupled to the first inverter, and configured to receive the second flop bit, wherein the first EDC generator iteratively generates the second checksum data further based on the second flop bit such that the second checksum data for each iteration is a checksum of the second reference data generated for the corresponding iteration and the second flop bit, wherein the second EDC generator is further coupled to the toggle register, and configured to retrieve the updated first flop bit from the toggle register, and wherein the second EDC generator generates the third checksum data further based on the updated first flop bit such that the third checksum data is a checksum of the updated first reference data and the updated first flop bit.

5. The IC of claim 3, wherein at a previous triggering edge of the first clock signal, the state register and the toggle register store the first reference data and the first flop bit, respectively, and at a previous triggering edge of the second clock signal, the EDC register stores the first checksum data, wherein the previous triggering edge of the first clock signal precedes the reference triggering edge of the first clock signal and the previous triggering edge of the second clock signal precedes the reference triggering edge of the second clock signal, wherein between the previous triggering edge and the reference triggering edge of each of the first clock signal and the second clock signal, the first inverter generates the second flop bit, the logic circuitry executes the logic function to iteratively generate the second reference data, and the first EDC generator iteratively generates the second checksum data based on the second flop bit and the iteratively generated second reference data, and wherein at the reference triggering edge of the first clock signal, the first reference data of the state register is updated with the corresponding second reference data and the first flop bit of the toggle register is updated with the second flop bit, and at the reference triggering edge of the second clock signal, the first checksum data of the EDC register is updated with the corresponding second checksum data.

6. The IC of claim 2, wherein the comparator is further configured to generate a first result bit based on the comparison of the updated first checksum data and the third checksum data, and wherein the first result bit is asserted based on the mismatch between the updated first checksum data and the third checksum data and de-asserted based on a match between the updated first checksum data and the third checksum data.

7. The IC of claim 6, wherein the fault detection system further comprises a first error register that is coupled to the comparator, and configured to store a first output bit, wherein the comparator is further configured to update the first output bit of the first error register with the first result bit at a subsequent triggering edge of the first clock signal, wherein the subsequent triggering edge of the first clock signal is subsequent to the reference triggering edge of the first clock signal, and wherein one or more recovery operations associated with the detected fault are executed based on the first output bit.

8. The IC of claim 6, wherein the fault detection system further comprises:

a second error register configured to store a second output bit; and a second inverter that is coupled to the comparator and the second error register, and configured to generate a second result bit that is an inverted version of the first result bit and update the second output bit of the second error register with the second result bit at a subsequent triggering edge of the second clock signal, wherein the subsequent triggering edge of the second clock signal is subsequent to the reference triggering edge of the second clock signal, and wherein one or more recovery operations associated with the detected fault are executed based on the second output bit.

9. The IC of claim 1, wherein a presence of the fault in the IC is indicative of a fault injection attack on the IC.

10. The IC of claim 9, wherein the fault injection attack corresponds to at least one of a group consisting of a power glitching attack, a clock glitching attack, an electromagnetic fault injection attack, a light injection attack, and a forward body bias injection attack.

11. The IC of claim 1, wherein the second reference data of a last iteration is generated before the reference triggering edge of each of the first clock signal and the second clock signal.

12. The IC of claim 1, further comprising a first clocking circuit and a second clocking circuit configured to generate the first clock signal and the second clock signal, respectively, wherein the first clock signal and the second clock signal are logically equivalent, and wherein the first clocking circuit and the second clocking circuit correspond to different branches of a clock tree associated with the IC.

13. The IC of claim 1, further comprising a functional system configured to execute one or more critical operations associated with the IC, wherein the fault detection system is present within a predefined distance of the functional system to enable detection of a fault injection attack on the functional system.

14. The IC of claim 1, further comprising a first reset circuit and a second reset circuit configured to generate a first reset signal and a second reset signal, respectively, wherein the first reset signal and the second reset signal are logically equivalent, wherein the first reset signal controls a reset operation of the state register and the second reset signal controls a reset operation of the EDC register, and wherein the first reset circuit and the second reset circuit correspond to different branches of a reset tree associated with the IC.

15. The IC of claim 1, wherein the logic circuitry comprises a plurality of logical elements that enable the execution of the logic function, and wherein a number of logical elements of the plurality of logical elements is determined based on at least one of a group consisting of a frequency of the first clock signal and a technology node associated with the IC.

16. The IC of claim 1, wherein the logic function corresponds to at least one of a group consisting of a linear feedback shift register function, a matrix multiplication function, a non-linear feedback shift register function, and an S-box function.

17. A method comprising:

storing, by a state register and an error detection code (EDC) register of a fault detection system, first reference data and first checksum data, respectively, wherein an operation of the state register is synchronous with a first clock signal and an operation of the EDC register is synchronous with a second clock signal;

executing, by logic circuitry of the fault detection system, a logic function based on the first reference data to iteratively generate second reference data that is different from the first reference data;

iteratively generating, by a first EDC generator of the fault detection system, second checksum data, wherein the second checksum data is generated for each iteration based on the second reference data generated for the corresponding iteration;

updating, by the logic circuitry, the first reference data of the state register at a reference triggering edge of the first clock signal with the corresponding second reference data;

updating, by the first EDC generator, the first checksum data of the EDC register at a reference triggering edge of the second clock signal with the corresponding second checksum data; and detecting, by an EDC checker of the fault detection system, a fault in the IC based on the updated first reference data and the updated first checksum data.

18. The method of claim 17, wherein the detection of the fault further comprises:

retrieving, by a second EDC generator of the EDC checker, the updated first reference data from the state register;

generating, by the second EDC generator, third checksum data based on the updated first reference data;

retrieving, by a comparator of the EDC checker, the updated first checksum data from the EDC register; and comparing, by the comparator, the updated first checksum data and the third checksum data, wherein the fault in the IC is detected based on a mismatch between the updated first checksum data and the third checksum data.

19. The method of claim 18, further comprising:

storing, by a toggle register of the fault detection system, a first flop bit, wherein an operation of the toggle register is synchronous with the first clock signal;

generating, by a first inverter of the fault detection system, a second flop bit that is an inverted version of the first flop bit; and updating, by the first inverter, the first flop bit of the toggle register at the reference triggering edge of the first clock signal with the second flop bit, wherein the second checksum data is iteratively generated further based on the second flop bit such that the second checksum data for each iteration is a checksum of the second reference data generated for the corresponding iteration and the second flop bit, and wherein the third checksum data is generated further based on the updated first flop bit such that the third checksum data is a checksum of the updated first reference data and the updated first flop bit.

20. The method of claim 17, wherein a presence of the fault in the IC is indicative of a fault injection attack on the IC, and wherein the fault injection attack corresponds to at least one of a group consisting of a power glitching attack, a clock glitching attack, an electromagnetic fault injection attack, a light injection attack, and a forward body bias injection attack.

* * * * *